(12) United States Patent
Kumaki et al.

(10) Patent No.: US 6,918,002 B2
(45) Date of Patent: Jul. 12, 2005

(54) DATA PROCESSOR AND DATA PROCESSING METHOD REDUCED IN POWER CONSUMPTION DURING MEMORY ACCESS

(75) Inventors: Satoshi Kumaki, Hyogo (JP); Tetsuya Matsumura, Hyogo (JP); Hiroshi Segawa, Hyogo (JP); Atsuo Hanami, Hyogo (JP); Vasile Mosneaga, 304 Kaizer Bldg., 2-5-32, Umebayashi, Jonan-ku, Fukuoka-shi, Fukuoka 814-0144 (JP)

(73) Assignees: Renesas Technology Corp., Tokyo (JP); Vasile Mosneaga, Fukuoka (JP)

( * ) Notice: Subject to any disclaimer, the term of this patent is extended or adjusted under 35 U.S.C. 154(b) by 268 days.

(21) Appl. No.: 10/053,545

(22) Filed: Jan. 24, 2002

(65) Prior Publication Data

US 2002/0188798 A1 Dec. 12, 2002

(30) Foreign Application Priority Data

Jun. 7, 2001 (JP) ...................................... 2001-172339

(51) Int. Cl.$^7$ .............................................. G06F 12/00
(52) U.S. Cl. ........................ 711/104; 711/105; 711/108; 711/111; 365/226; 365/227; 365/228; 365/229
(58) Field of Search ................................. 711/104, 105, 711/108, 111; 365/226, 227, 228, 229

(56) References Cited

U.S. PATENT DOCUMENTS

| | | | | |
|---|---|---|---|---|
| 5,931,927 A | * | 8/1999 | Takashima | 710/65 |
| 6,005,422 A | * | 12/1999 | Morinaka et al. | 327/141 |
| 6,005,623 A | * | 12/1999 | Takahashi et al. | 375/240.16 |
| 6,259,383 B1 | * | 7/2001 | Miki | 341/52 |
| 6,292,868 B1 | * | 9/2001 | Norman | 711/103 |
| 6,304,482 B1 | * | 10/2001 | Lin et al. | 365/154 |
| 6,400,633 B1 | * | 6/2002 | Al-Shamma et al. | 365/227 |
| 6,442,077 B2 | * | 8/2002 | Shin | 365/189.07 |
| 6,560,288 B1 | * | 5/2003 | Gilbert et al. | 375/240.23 |
| 6,611,473 B2 | * | 8/2003 | Al-Shamma et al. | 365/227 |
| 6,633,951 B2 | * | 10/2003 | Cohen | 711/105 |
| 2002/0090142 A1 | * | 7/2002 | Igarashi et al. | |
| 2003/0086302 A1 | * | 5/2003 | Kurakata et al. | 365/189.02 |

FOREIGN PATENT DOCUMENTS

JP  5-298894  11/1993

OTHER PUBLICATIONS

"Mitsubishi Semiconductor data book 1997 Memory SRAM" Mitsubishi Denki Kabushiki Kaisha, pp. 2–9, 2–15.

* cited by examiner

*Primary Examiner*—Donald Sparks
*Assistant Examiner*—Ngoc Dinh
(74) *Attorney, Agent, or Firm*—McDermott Will & Emery LLP

(57) ABSTRACT

When the CPU writes data into a memory, a 0 detection circuit detects the number of bits having the value 0 from the data. When the number of bits with 0 is equal to or larger than the number of bits with 1, the data output from the CPU is provided to the memory under control of a selector. When the number of bits with 0 is fewer than the number of bits with 1, the data output from the CPU is inverted and provided to the memory under control of the selector. Accordingly, the rewriting frequency of each memory cell from 0 to 1 or from 1 to 0 in the memory can be reduced in average. Thus the power consumption of the memory in a data writing mode can be reduced.

6 Claims, 8 Drawing Sheets

DATA PROCESSOR AND DATA PROCESSING METHOD REDUCED IN POWER CONSUMPTION DURING MEMORY ACCESS

BACKGROUND OF THE INVENTION

1. Field of the Invention

The present invention relates to a data processor that carries out processing while accessing the memory and a method thereof, particularly to a data processor and data processing method directed to reduce power consumption during memory access.

2. Description of the Background Art

The processing speed of microprocessors has increased drastically these few years. The clock frequency of microprocessors and the frequency of the microprocessor accessing the memory have increased correspondingly. The data processor incorporating such a microprocessor is prone to consume more power.

In order to increase the operating period of time for data processors that operate by battery such as portable information apparatuses, the technology of reducing the power consumption of the entire data processor is now indispensable.

In many cases, the conventional data processor employs a SRAM (Static Random Access Memory) and a DRAM (Dynamic Random Access Memory) as the memory incorporated therein. Particularly in the case of the SRAM having the unitary circuit storing information of 1 bit constituted by flip flop circuits formed mainly of CMOS (Complementary Metal Oxide Semiconductor) circuits, power consumption of the SRAM will increase when the data to be stored in a memory element is inverted during the data writing mode.

Many conventional data processors have the memory such as the SRAM connected directly to the data bus. Data is written randomly into the memory, causing the data stored in the memory element to be altered frequently. Thus, there was a problem that the power consumption could not be suppressed.

SUMMARY OF THE INVENTION

An object of the present invention is to provide a data processor and data processing method of converting write data to allow reduction in the power consumption of the memory in a data writing mode.

Another object of the present invention is to provide a data processor and data processing method that can reduce the access frequency to the memory to allow reduction in the power consumption of the memory during a memory access mode.

According to an aspect of the present invention, a data processor includes a random access memory, a processing unit that carries out data processing while accessing the random access memory, and a conversion unit converting data so that the number of bits having a predetermined value out of the data is at least a predetermined number when the processing unit writes data into the random access memory, and providing the converted data to the random access memory.

Since the conversion unit converts data so that the number of bits having a predetermined value out of the write data is at least a predetermined number for output to the random access memory, the rewriting frequency of each memory cell from 0 to 1 or from 1 to 0 in the random access memory can be reduced in average. Therefore, the power consumption of the random access memory during data writing can be reduced.

According to another aspect of the present invention, a data processor includes a random access memory, a processing unit carrying out data processing while accessing the random access memory, a first retain circuit storing previously data output by the processing unit, and a subtracter taking the difference between the previous data stored in the retain circuit and the current data output by the processing unit when the processing unit writes data into the random access memory.

Since the subtracter takes the difference between the previous data stored in the retain circuit and the current data output from the processing unit, data conversion can be effected so that there are more bits with 0 when the correlation between data is high. Accordingly, the rewriting frequency of each memory cell from 0 to 1 or from 1 to 0 in the random access memory can be reduced in average. Therefore, the power consumption of the random access memory during data writing can be reduced.

According to a further aspect of the present invention, a data processing method of carrying out data processing while accessing a random access memory includes the steps of converting write data so that the number of bits having a predetermined value out of the write data is at least a predetermined number, and writing the converted write data into the random access memory.

Since the data is converted so that the number of bits having a predetermined value out of the write data is at least a predetermined number and written into the random access memory, the rewriting frequency of each memory cell from 0 to 1 or from 1 to 0 in the random access memory can be reduced in average. Therefore, the power consumption of the random access memory during data writing can be reduced.

According to still another aspect of the present invention, a data processing method of carrying out data processing while accessing a random access memory includes the steps of storing previous write data, obtaining the difference between the stored previous write data and the current write data, and writing the difference data into the random access memory.

Since the difference between the stored previous write data and the current write data is taken, data conversion can be effected so that there are more bits with 0 when the correlation between data is high. Therefore, the rewriting frequency of each memory cell from 0 to 1 or from 1 to 0 in the random access memory can be reduced in average. Thus, the power consumption of the random access memory during data writing can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
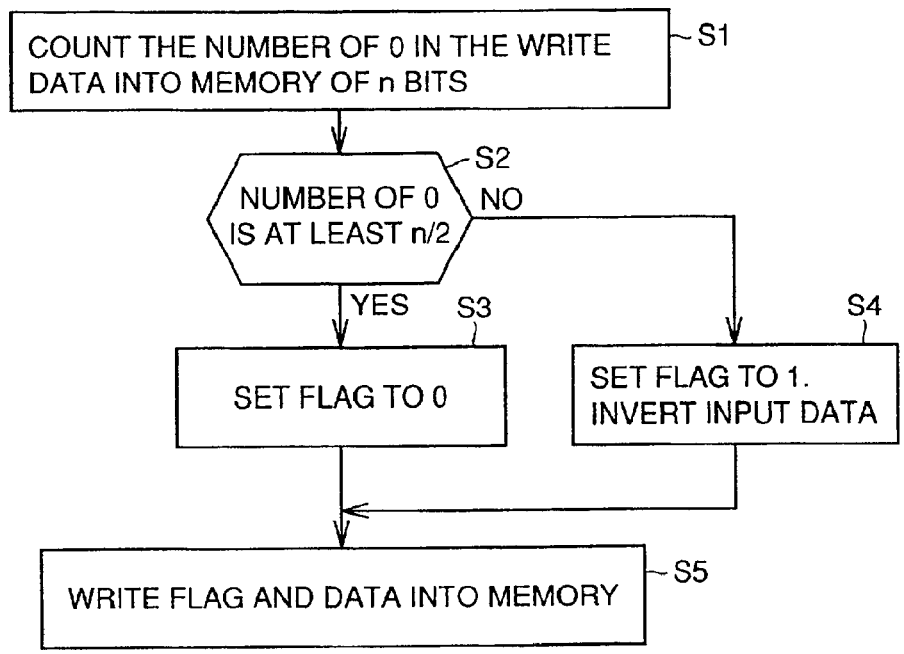
FIG. 1 is a flow chart to describe the procedure of writing data to a memory in a data processor according to a first embodiment of the present invention.

FIG. 1 is a flow chart to describe the procedure of writing data into a memory of a data processor according to a first embodiment of the present invention. The data processor of the present embodiment exhibits significant effect in the case where a SRAM is employed as the incorporated memory. However, the present invention is also applicable to a data processor employing a DRAM, a pseudo SRAM, or the like. The number of bits that can be handled at one time by the CPU (Central Processing Unit) and the memory is assumed to be n bits.

When the CPU writes data of n bits into the memory, the number of bits corresponding to 0 are counted from the n-bit data (S1). Then, determination is made whether the number of bits with 0 is at least n/2 or not (S2). When the number of bits with 0 is at least n/2 (YES at S2), the flag is set to 0 (S3). The n-bit data and the flag of 1 bit are written into the memory (S5).

When the number of bits with 0 is less than n/2 (NO at S2), the flag is set to 1, and each bit of the n-bit data is inverted (S4). The inverted n-bit data and the flag of 1 bit are written into the memory (S5).

Figure 2:
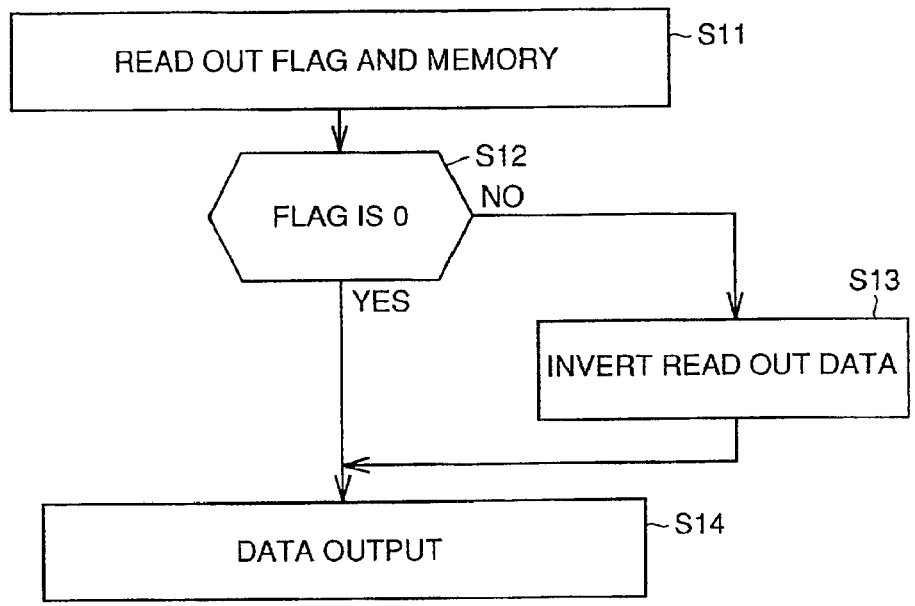
FIG. 2 is a flow chart to describe the procedure of reading out data from the memory of the data processor of the first embodiment.

FIG. 2 is a flow chart to describe the procedure of reading out data from the memory of the data processor of the first embodiment. When the CPU reads out data of n bits from the memory, the flag is read out from the memory together with the data (S11). Determination is made whether the flag is 0 or not (S12). If the flag is 0 (YES at S12), the data from the memory are directly output. The CPU reads in the data (S14).

If the flag is 1 (NO at S12), the data from the memory is inverted and output (S13). The inverted data is read in by the CPU (S14).

Figure 3:
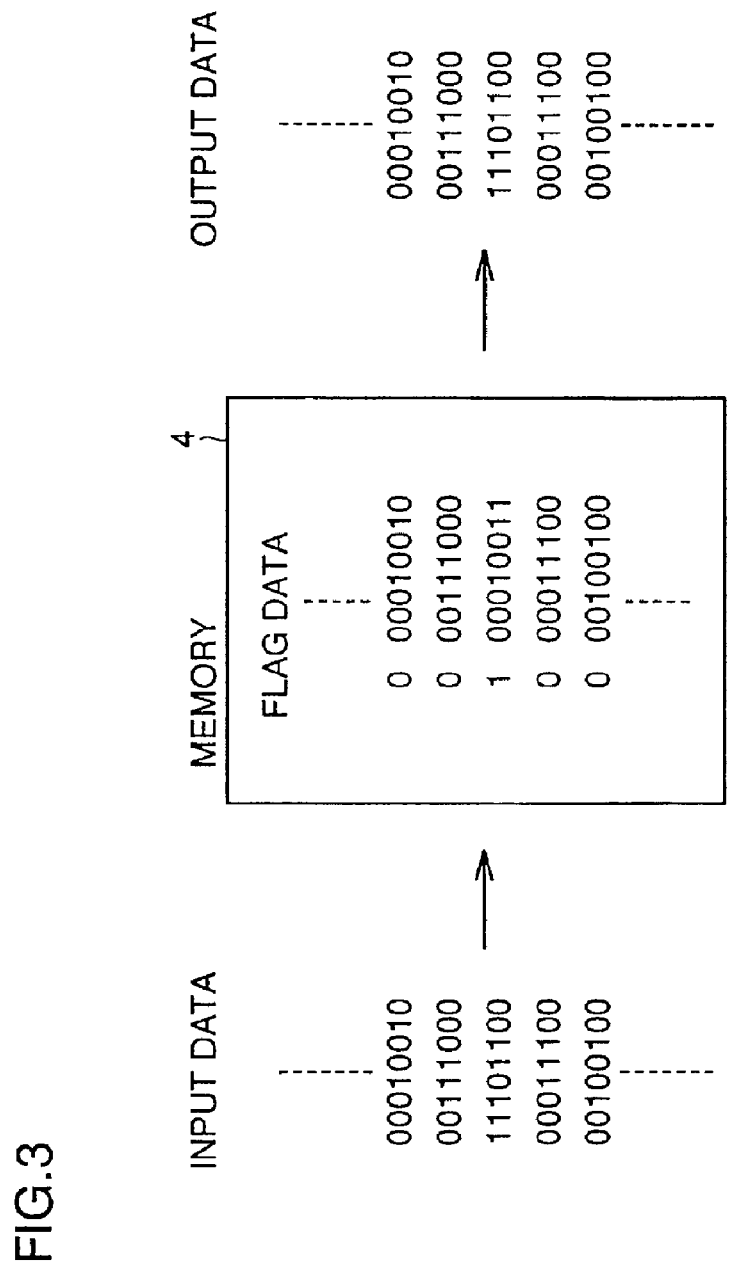
FIG. 3 schematically shows an example of the processing contents of the data processor of the first embodiment.

FIG. 3 schematically shows an example of the processing contents of the data processor of the embodiment shown in FIGS. 1 and 2. Here, the number of bits of the memory is 8 bits. A flag of 1 bit is added to each data. For example, consider the case where the input data (the data written into the memory by the CPU) is 00010010. Since the number of bits with 0 is 6, the flag is set to 0 and written into the memory. Also, the data output from the CPU is directly written into the memory. When the CPU reads out this data from the memory, the data output from the memory is directly provided as the output data (the data to be read from the memory by the CPU).

When the input data is 11101100, there are three bits with 0. The flag is set to 1 and written into the memory. The data output from the CPU is inverted, and data 00010011 is written into the memory. When the CPU reads out this data from the memory, the data output from the memory is inverted and provided as output data 11101100.

Since data is converted so that there are always more bits with 0 and then written into the memory, the rewriting frequency of each memory cell from 0 to 1 or from 1 to 0 in the memory can be reduced. Therefore, the power consumption of the memory in writing data into the memory can be reduced.

Figure 4:
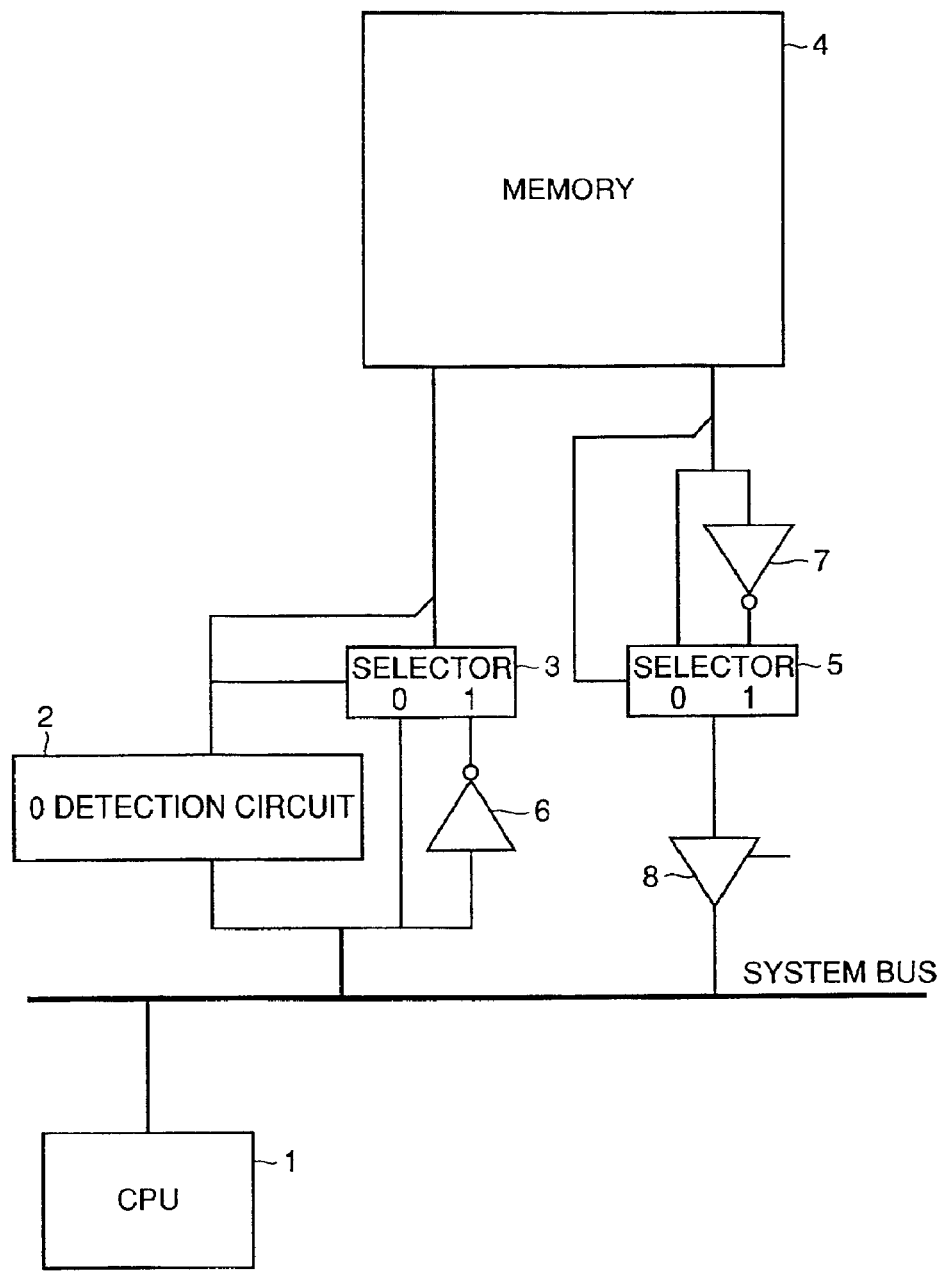
FIG. 4 is a block diagram schematically showing a structure of the data processor of the first embodiment.

FIG. 4 is a block diagram showing a schematic structure of the data processor of the first embodiment. The data processor includes a CPU 1, a 0 detection circuit 2 detecting the number of bits with 0 from the data output by the CPU 1 to the system bus and providing the detection result as a flag, a selector 3 responsive to the flag output from 0 detection circuit 2 to select and output either the data output from CPU 1 or inverted data thereof, a memory 4, a selector 5 responsive to the flag output from memory 4 to select and output either the data output from memory 4 or inverted data thereof, inverters 6 and 7, and a buffer 8.

Each circuit of the data processor of FIG. 4 is contemplated to be integrated and configured on one semiconductor chip. However, the present invention is not limited to such a configuration. For example, CPU 1 and memory 4 may be provided at separate semiconductor chips with the remaining circuits integrated on the semiconductor chips of CPU 1 or memory 4.

It is assumed that the number of selectors 3 and 5, inverters 6 and 7 and buffer 8 are equal to the number of bits of the system bus. The control signals (not shown) of CPU 1, memory 4 and buffer 8 are similar to those of a general data processor. Therefore, detailed description will not be provided here.

0 detection circuit 2 detects the number of bits with 0 from the input data and sets the flag to 0 for output when the detected number of bits is at least a predetermined value. In the case where the number of bits with 0 in the input data is lower than the predetermined value, the flag is set to 1 for output.

When the flag output from 0 detection circuit 2 is 0, selector 3 selects and outputs the input data of the system bus. In contrast, when the flag output from 0 detection circuit 2 is 1 selector 3 selects and outputs the data inverted by inverter 6. The flag output from 0 detection circuit 2 and the data output from selector 3 are written into memory 4 at the timing of CPU 1 writing data into memory 4.

When the flag output from memory 4 is 0, selector 5 selects and outputs the data output from memory 4. In contrast, when the flag output from memory 4 is 1, selector 5 selects and outputs the data inverted by inverter 7. Buffer 8 outputs the data from selector 5 at the timing of CPU 1 reading out data from memory 4, and attains a high impedance state otherwise.

Figure 5:
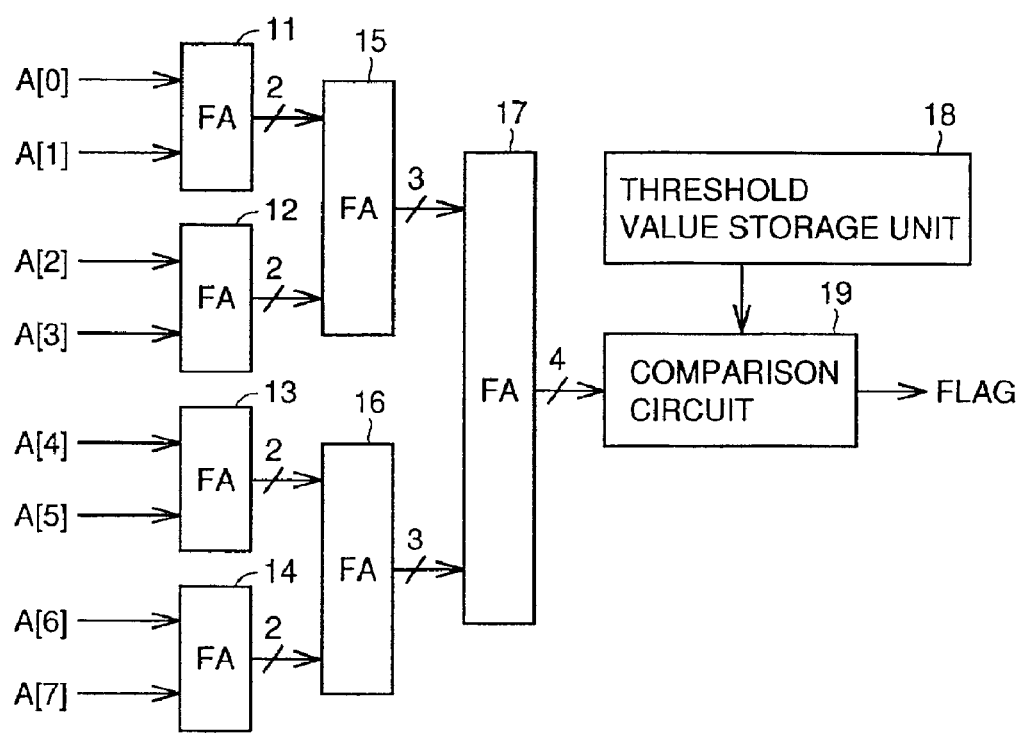
FIG. 5 is a block diagram showing a schematic structure of a 0 detection circuit 2.

FIG. 5 is a block diagram showing a schematic structure of 0 detection circuit 2. 0 detection circuit 2 includes FAs (Full Adder) 11–17, a threshold value storage unit 18, and a comparison circuit 19. Although this 0 detection circuit 2 corresponds to the case where the number of bits of the system bus is 8 bits, 0 detection circuit 2 can be configured similarly by increasing the number of FAs in the case where the number of bits of the system bus corresponds to 16 bits, 32 bits, or the like. Signals A[0]–A[7] are the inverted signals of each bit on the system bus (data bus).

Each of FAs 11–14 adds the two inputs of 1-bit data and outputs the added data as 2-bit data. Each of FAs 15 and 16 adds the two inputs of the 2-bit data to output the added data as 3-bit data. FA 17 adds the two inputs of the 3-bit data to output the added data as 4-bit data.

Threshold value storage unit 18 is prestored with a threshold value used in determining the flag. Comparison circuit 19 compares the number of bits with 0 output from FA 17 with the threshold value output from threshold value storage unit 18 and outputs a flag of 0 when the number of bits with 0 is equal to or greater than the threshold value, and output a flag of 1 when the number of bits with 0 is below the threshold value. This threshold value is 4, 8, and 16 when the data is 8 bits, 16 bits, and 32 bits, respectively.

The above description is based on a structure where the data is converted so that there are always more bits with 0 to be written into memory 4. A similar effect is obtained by converting the data so that there are always more bits with 1 to be written into memory 4.

According to the data processor of the present embodiment, data is converted so that there are always more bits with 0 or 1 to be written into memory 4. Therefore, the rewriting frequency of each memory cell from 0 to 1 or 1 to 0 in memory 4 can be reduced in average. Thus, the current consumption of the memory in the data writing mode into memory 4 can be reduced.

Second Embodiment

Figure 6:
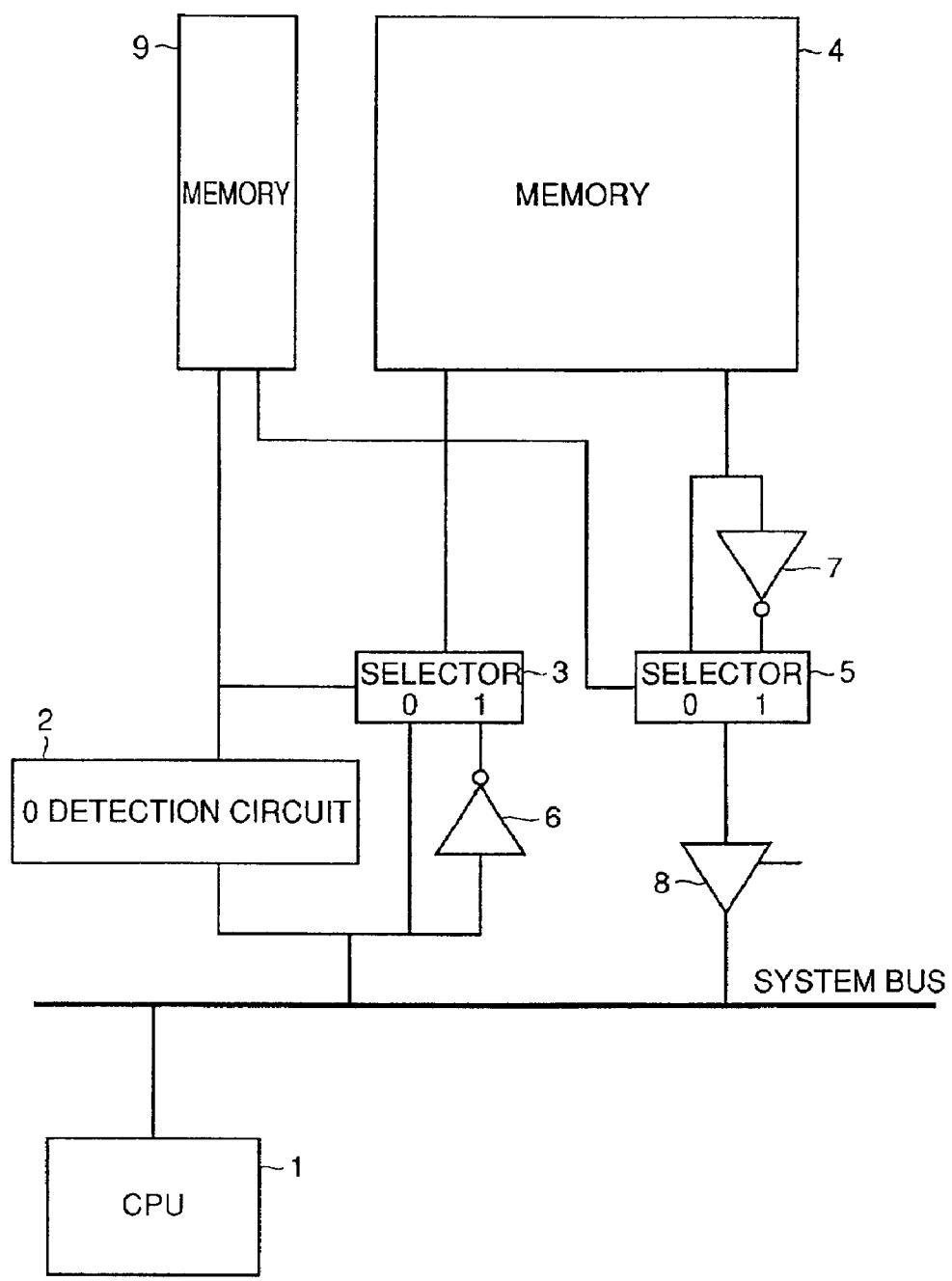
FIG. 6 is a block diagram showing a schematic structure of a data processor according to a second embodiment of the present invention.

FIG. 6 is a block diagram showing a schematic structure of a data processor according to a second embodiment of the present invention. The data processor includes CPU 1, 0 detection circuit 2 detecting the number of bits with 0 from the data output by the CPU 1 onto the system bus and providing the detected result as a flag, selector 3 responsive to the flag output from 0 detection circuit 2 to select and output either the data output from CPU 1 or the inverted data thereof, memory 4, selector 5 selecting either the data output from memory 4 or the inverted data thereof for output, inverters 6 and 7, buffer 8, and a memory 9 into which the flag from 0 detection circuit 2 is written.

Although each circuit in the data processor of FIG. 6 is contemplated to be integrated and configured on one semiconductor chip, the present invention is not limited to such a structure. For example, CPU 1 and memory 4 may be provided at separate semiconductor chips with the remaining circuits integrated on the semiconductor chip of CPU 1 or memory 4.

0 detection circuit 2 detects the number of bits with 0 from the input data and sets the flag to 0 for output when the number of detected bits is at least a predetermined value. When the number of bits with 0 from the input data is lower than the predetermined value, the flag is set to 1 for output.

When the flag output from 0 detection circuit 2 is 0, selector 3 selects and outputs the input data of the system bus. In contrast, when the flag output from 0 detection circuit 2 is 1, selector 3 selects and outputs the data inverted by inverter 6. The flag output from 0 detection circuit 2 is written into memory 9 at the timing of CPU 1 writing data into memory 4. The data output from selector 3 is written into memory 4 at the timing of CPU 1 writing data into memory 4. The flag is written into memory 9 corresponding to respective data written into memory 4. The corresponding flag is read out from memory 9 simultaneously with the read out of data from memory 4.

When the flag output from memory 9 is 0, selector 5 selects and outputs the data from memory 4. In contrast, when the flag output from memory 9 is 1, selector 5 selects and outputs the data inverted by inverter 7. Buffer 8 outputs data from selector 5 at the timing of CPU 1 reading out data from memory 4, and attains a high impedance state otherwise.

The present embodiment was described in which the flag is written into memory 9. A similar effect can be obtained even if the flag is written into a circuit that stores a value such as a flip flop.

According to the data processor of the present embodiment, data is converted so that there are always more bits with 0 or 1 to be written into memory 4. Therefore, the rewriting frequency of each memory cell from 0 to 1 or from 1 to 0 in memory 4 can be reduced in average. The power consumption of the memory in writing data into memory 4 can be reduced.

Third Embodiment

The data processor of the present embodiment has a structure applicable to the case where data is written/read out continuously to/from a memory and there is a high correlation between these data. Since the previous input data approximates closely to the current input data, the difference between the previous input data and the current input data is obtained to convert the data so that there are more bits with 0 in writing data into the memory.

Figure 7:
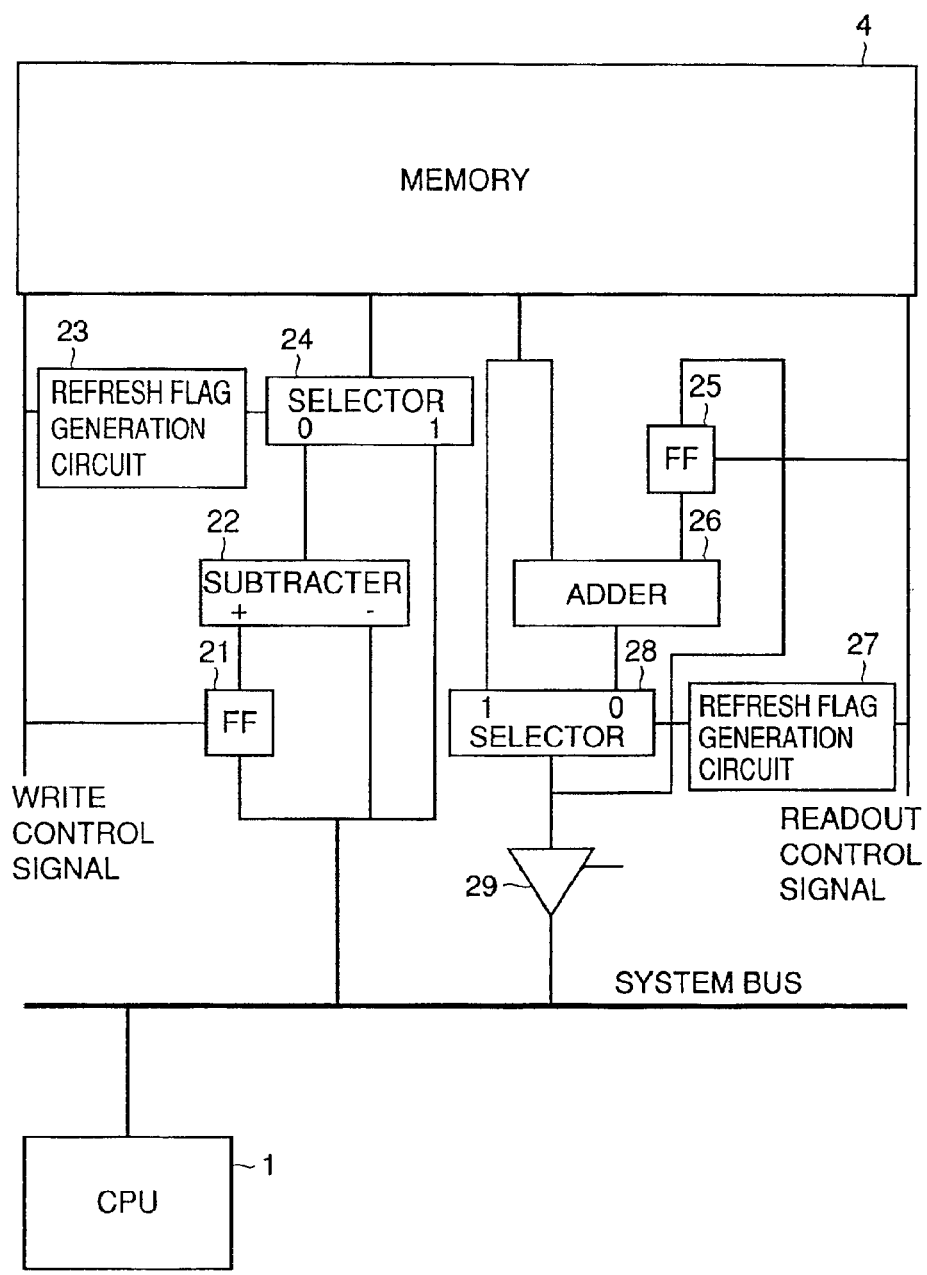
FIG. 7 is a block diagram showing a schematic structure of a data processor according to a third embodiment of the present invention.

FIG. 7 is a block diagram showing a schematic structure of the data processor of the third embodiment. The data processor includes a CPU 1, a memory 4, a FF (Flip Flop) 21 storing the previous input data, a subtracter 22 taking the difference between the previous input data stored in FF 21 and the current input data, a refresh flag generation circuit 23 generating and providing a refresh flag periodically, a selector 24 responsive to the refresh flag output from refresh flag generation circuit 23 to switch between the data output from subtracter 22 and the input data from system bus for output to memory 4, a FF 25 storing the previous output data, an adder 26 adding the previous output data stored in FF 25 and the difference data output from memory 4, a refresh flag generation circuit 27 generating and providing a refresh flag periodically, a selector 28 responsive to the refresh flag output from refresh flag generation circuit 27 to switch between the output data from memory 4 and the output data from adder 26 for output, and a buffer 29. It is assumed that the number of FFs 21 and 25, selectors 24 and 28, and buffer 29 are equal to the number of bits of the system bus.

Although each circuit of the data processor of FIG. 7 is contemplated to be integrated and configured on one semiconductor chip, the present invention is not limited to such a structure. For example, CPU 1 and memory 4 may be provided at separate semiconductor chips with the remaining circuits integrated on a semiconductor chip of CPU 1 or memory 4.

A write control signal is the signal output when CPU 1 writes data into memory 4. A readout control signal is the signal output when CPU 1 reads out data from memory 4. FF 21 responds to the write control signal to store input data and provide the data to subtracter 22. Subtracter 22 takes the difference between the previous input data output from FF 21 and the current input data and provides the difference to selector 24.

Refresh flag generation circuit 23 counts the number of write control signals to set the refresh flag to 1 for output to selector 24 at the time of writing the first data of the input data and at the time of writing input data of a constant period from the first data. At other times of writing the input data, the refresh flag is set to 0 for output to selector 24.

When the refresh flag is 1, selector 24 provides the input data of the system bus to memory 4. When the refresh flag is 0, the difference data output from subtracter 22 is provided to memory 4. Thus, the input data that is not subtracted is written into memory 4 at a constant period of write timing whereas difference data is written into memory 4 at other write timings.

FF 25 responds to the readout control signal to store the data output from selector 28, and provides the stored data to adder 26. Adder 26 adds the previous output data from FF 25 with the differential data output from memory 4 for output to selector 28.

Refresh flag generation circuit 27 counts the number of readout control signals to set refresh flag to 1 for output to selector 28 when reading out the first data of the output data and when reading out the output data of a constant period from the first data. At other times of reading the output data, the refresh flag is set to 0 for output to selector 28. The first data in writing the input data and the first data in reading out the output data are the same data stored in the same address. The cycle in writing input data and the cycle in reading out the output data are the same cycle.

When the refresh flag is 1, selector 28 provides the output data from memory 4 to the system bus. When the refresh flag is 0, the output data from adder 26 is provided to the system bus. Thus, output data that is not subtracted is read out from memory 4 at the read out timing of a constant cycle whereas data that is subtracted is read out from memory 4 at other read out timings. The previous output data is added with the difference data to be provided to the system bus.

Figure 8:
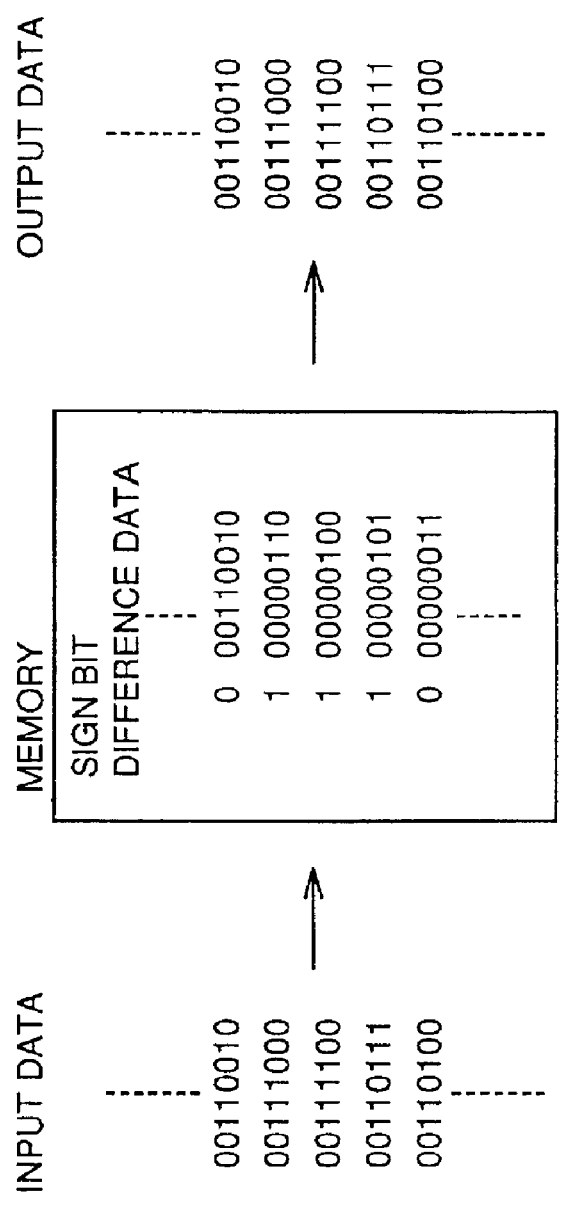
FIG. 8 schematically shows an example of the processing contents of the data processor of the third embodiment.

FIG. 8 schematically shows an example of the processing contents of the data processor of the present embodiment shown in FIG. 7. Here, the number of bits of the memory is set to 8 bits, and a sign bit of 1 bit is added to each data. The sign bit is set to 0 when the previous input data is larger than the current input data, and set to 1 when the previous input data is smaller than the current input data. When the sign bit is 1, the two's complement of (the previous input data—current input data) is written into memory 4 as difference data.

Although a sign bit generation circuit is not illustrated, it can be realized by a circuit that sets the sign bit to 1 when borrow occurs at the most significant bit and set to 0 when no borrow occurs at the most significant bit.

When the sign bit is 1 in reading out output data, adder 26 adds the difference data output from memory 4 and the previous output data from FF 25 to generate output data. When the sign bit is 0 in reading out the output data, adder 26 adds the two's complement of the difference data output from memory 4 and the previous output data from FF 25 to generate output data.

For example, when the previous input data is 00110010 and the current input data is 00111000 in writing the input data, the sign bit is set to 1. That sign bit and difference data 00000110 are written into memory 4. When the previous input data is 00110111 and the current input data is 00110100, the sign bit is set to 0, and that sign bit and difference data 00000011 are written into memory 4.

In the case where the previous output data is 00110010, the sign bit is 1, and the difference data is 00000110 in reading out output data, adder 26 adds the previous output data and the difference data for output to selector 28. In the case where the previous output data is 00110111, the sign bit is 0, and difference data 00000011, adder 26 adds the previous output data and the two's complement of the difference data for output to selector 28.

By using a signed representation for the difference data, more "0"s will appear at the MSB (Most Significant Bit) side. The rewriting frequency of each memory cell from 0 to 1 or from 1 to 0 in memory 4 can be reduced in writing input data to memory 4.

According to the data processor of the present embodiment, the difference between the previous input data and the current input data, when the correlation therebetween is high, is taken so that the number of bits with 0 is increased to be written into memory 4. Therefore, the rewriting frequency of each memory cell from 0 to 1 from 1 to 0 in memory 4 can be reduced in average. Thus, the power consumption of the memory in writing data into the memory can be reduced.

Fourth Embodiment

The data processor of the present embodiment has a structure applicable to the case of writing/reading out data continuously to/from the memory and when there is a high correlation between these data. Specifically, since the previous input data approximates close to the current input data, the difference between the previous input data and the current input data is taken and then compressed by carrying out variable-length coding. Accordingly, the number of accesses to memory 4 is reduced.

Figure 9:
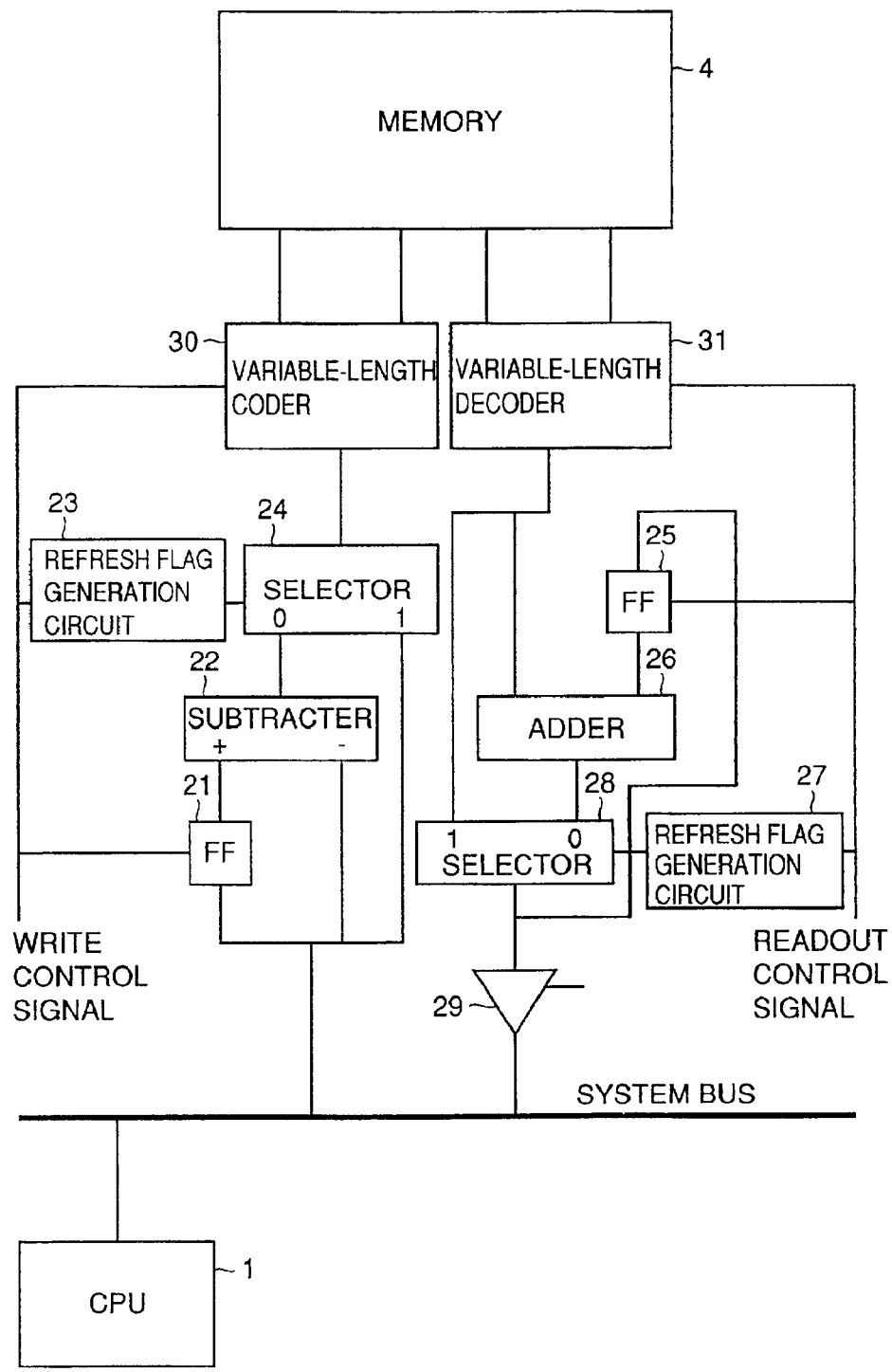
FIG. 9 is a block diagram showing a schematic structure of a data processor according to a fourth embodiment of the present invention.

FIG. 9 is a block diagram showing a schematic structure of the data processor of the fourth embodiment of the present invention. The data processor includes CPU 1, memory 4, FF (Flip Flop) 21 storing the previous input data, subtracter 22 taking the difference between the previous input data stored in FF 21 and the current input data, refresh flag generation circuit 23 generating and providing a refresh flag periodically, selector 24 responsive to the refresh flag output from refresh flag generation circuit 23 to switch between the data output from subtracter 22 and the input data of the system bus for output, FF 25 storing the previous output data, adder 26 adding the previous output data stored in FF 25 and the difference data, refresh flag generation circuit 27 generating and providing a refresh flag periodically, selector 28 responsive to the refresh flag output from refresh flag generation circuit 27 to switch the output data, buffer 29, a variable-length coder 30 applying variable-length coding on the data output from selector 24 for output to memory 4, a variable-length decoder 31 applying variable-length decoding on the coded data output from memory 4. It is to be assumed that the number of FF 21 and 25, selectors 24 and 28, and buffer 29 is equal to the number of bits of the system bus. The structure of the data processor of the present invention other than variable-length coder 30 and variable-length decoder 31 is similar to that of the data processor of the third embodiment shown in FIG. 7. Therefore, detailed description thereof will not be repeated.

Although each circuit of the data processor of FIG. 9 is contemplated to be integrated and configured on one semiconductor chip, the structure is not limited thereto. For example, CPU 1 and memory 4 may be provided at separate semiconductor chips with the remaining circuits integrated on the semiconductor chip of CPU 1 or memory 4.

Variable-length coder 30 applies variable-length coding on the data output from selector 24 in synchronization with a write control signal. It is to be noted that there are more 0s at the MSB side of the difference data output from subtracter 22, as described in the third embodiment. Therefore, the difference data can be compressed by assigning the data a short code and applying variable-length coding. Thus, input data that is not subtracted is subjected to variable-length coding and written into memory 4 at a writing timing of a constant period. At a writing timing other than the constant period, the difference data is subjected to variable-length coding and written into memory 4.

Variable-length decoder 31 applies variable-length decoding on the data output from memory 4 in synchronization with a readout control signal and provides the decoded data to adder 26 and selector 28. Adder 26 adds the previous output data from FF 25 and the difference data that is subjected to variable-length decoding from variable-length decoder 31 for output to selector 28.

When the refresh flag is 1, selector 28 provides the output data subjected to variable-length decoding from variable-length decoder 31 onto the system bus. When the refresh flag is 0, the output data from adder 26 is provided to the system bus. Thus, at a readout timing of a constant cycle, variable-length decoder 31 applies variable-length decoding on the coded data of the output data not subtracted from memory 4. At other read out timings, variable-length decoder 31 applies variable-length decoding on the coded data of the difference data read out from memory 4.

According to the data processor of the present embodiment, the difference between the previous input data and the current input data, when the correlation therebetween is high, is taken and then subjected to variable-length coding. Accordingly, the access frequency to memory 4 can be reduced. Thus, the power consumption of memory 4 when writing/reading data into/from memory 4 can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data processor comprising:
   a random access memory;
   a processing unit for carrying out data processing while accessing said random access memory;
   a first retain circuit for storing previous data output by said processing unit; and
   a subtracter for taking a difference between the previous data stored in said retain circuit and current data output by said processing unit when said processing unit writes data into said random access memory, and generating difference data to be written into said random access memory based on the difference taken, the difference data indicating the difference between the previous data and the current data.

2. The data processor according to claim 1, further comprising a variable-length coder for applying variable-length coding on difference data output from said subtracter for output to said random access memory.

3. The data processor according to claim 1, further comprising:
   a first detection circuit for detecting a data write timing of a predetermined period including the write timing of the first data out of the data write timing into said random access memory by said processing unit; and
   a first selector for selecting data output from said processing unit at the timing detected by said first detection circuit for output, and selecting difference data output from said subtracter at a timing other than the timing detected by said first detection circuit for output.

4. The data processor according to claim 1, further comprising:
   a second retain circuit for storing previous data output to said processing unit; and
   an adder for adding difference data output from said random access memory to said previous data stored in said second retain circuit.

5. The data processor according to claim 4, further comprising a variable-length decoder for applying variable-length decoding on variable-length coded difference data output from said random access memory to output the decoded data to said adder.

6. The data processor according to claim 4, further comprising:
   a second detection circuit for detecting a data readout timing of a predetermined period including the readout timing of the first data among the data readout timing by said processing unit; and
   a second selector for selecting data output from said random access memory at the timing detected by said second detection circuit for output, and selecting the data output from said adder at a timing other than said timing detected by said second detection circuit for output.

* * * * *